(12) United States Patent
Araki

(10) Patent No.: US 10,985,749 B2
(45) Date of Patent: Apr. 20, 2021

(54) INTEGRATED CIRCUIT AND SEMICONDUCTOR DEVICE

(71) Applicant: FUJI ELECTRIC CO., LTD., Kawasaki (JP)

(72) Inventor: Ryu Araki, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/880,367

(22) Filed: May 21, 2020

(65) Prior Publication Data

US 2020/0395930 A1 Dec. 17, 2020

(30) Foreign Application Priority Data

Jun. 14, 2019 (JP) .............................. JP2019-111198

(51) Int. Cl.
*H03K 17/16* (2006.01)
*G01R 31/327* (2006.01)

(52) U.S. Cl.
CPC ....... *H03K 17/168* (2013.01); *G01R 31/3277* (2013.01); *H03K 17/165* (2013.01)

(58) Field of Classification Search
CPC . H03K 17/165; H03K 17/168; G01R 31/3277
USPC ................................................ 327/108–112
See application file for complete search history.

(56) References Cited

U.S. PATENT DOCUMENTS

| 2014/0203846 A1* | 7/2014 | Janschitz | H03K 17/284 327/109 |
| 2014/0340124 A1* | 11/2014 | Hirler | H03K 3/012 327/108 |

FOREIGN PATENT DOCUMENTS

| JP | 2007-228447 A | 9/2007 |
| JP | 2008-022451 A | 1/2008 |
| JP | 2013-047951 A | 3/2013 |
| JP | 2013-146008 A | 7/2013 |
| JP | 2017-229151 A | 12/2017 |
| JP | 2018-207276 A | 12/2018 |
| JP | 2019-033556 A | 2/2019 |
| WO | 2014/123046 A1 | 8/2014 |

\* cited by examiner

*Primary Examiner* — John W Poos
(74) *Attorney, Agent, or Firm* — Rabin & Berdo, P.C.

(57) ABSTRACT

A semiconductor device having a switch circuit and an integrated circuit. The switch circuit includes serially-connected first and second switching devices respectively on a power supply side and a ground side thereof, and first and second free-wheeling diodes connected respectively in parallel with the first and second switching devices. The integrated circuit performs switching of the second switching device, and including a detection circuit that detects a load current flowing through a load of the switch circuit, and a drive circuit that controls magnitude of a current flowing to the gate terminal of the second switching device, to thereby charge a gate capacitance of the second switching device according to a detection result of the detection circuit, when a received drive signal is at one logic level, and turns off the second switching device when the received drive signal is at another logic level.

8 Claims, 13 Drawing Sheets

INTEGRATED CIRCUIT AND SEMICONDUCTOR DEVICE

CROSS-REFERENCE TO RELATED APPLICATIONS

The present application claims priority pursuant to 35 U.S.C. § 119 from Japanese patent application number 2019-111198 filed on Jun. 14, 2019, the entire disclosure of which is hereby incorporated by reference herein.

BACKGROUND

Technical Field

The present invention relates to an integrated circuit and a semiconductor device.

Description of the Related Art

In a power conversion circuit such as an inverter circuit or the like, switching of an upper-arm switching device provided on the power supply side and a switching device provided on the ground side is performed, to generate a desired voltage (for example, Japanese Patent Application Publication No. 2013-146008).

When the lower-arm switching device is turned on, a reverse bias voltage is generated at a free-wheeling diode of the upper-arm switching device. Then, in general, the rate of change of the reverse bias voltage increases with a decrease in the current flowing through the free-wheeling diode of the upper arm. As a result, if the current flowing through the upper-arm free-wheeling diode decreases, large noise is generated when the lower-arm switching device is turned on.

The present disclosure has been achieved in view of an issue described above and an object thereof is to provide an integrated circuit that performs switching of a switching device while reducing noise.

SUMMARY

A main aspect of the present disclosure for solving an issue described above is an integrated circuit for a switch circuit, the switch circuit comprising a first switching device on a power supply side and a second switching device on a ground side, the first and second switching devices being connected in series, a first free-wheeling diode connected in parallel with the first switching device, and a second free-wheeling diode connected in parallel with the second switching device, the integrated circuit being configured to perform switching of the second switching device, the integrated circuit comprising: a detection circuit that detects a load current flowing through a load of the switch circuit; and a drive circuit that controls magnitude of a current for charging a gate capacitance of the second switching device according to magnitude of the load current when a drive signal is at one logic level, and turns off the second switching device when the drive signal is at another logic level.

According to the present disclosure, it is possible to provide an integrated circuit that performs switching of a switching device while reducing noise.

BRIEF DESCRIPTION OF THE DRAWINGS

FIG. 9 is a diagram illustrating main waveforms of a power module 10 when IGBT 31 is turned on.

DETAILED DESCRIPTION

At least the following details will become apparent from descriptions of the present specification and of the accompanying drawings.

Embodiments of the Present Disclosure
<<Outline of Power Module 10>>

Figure 1:
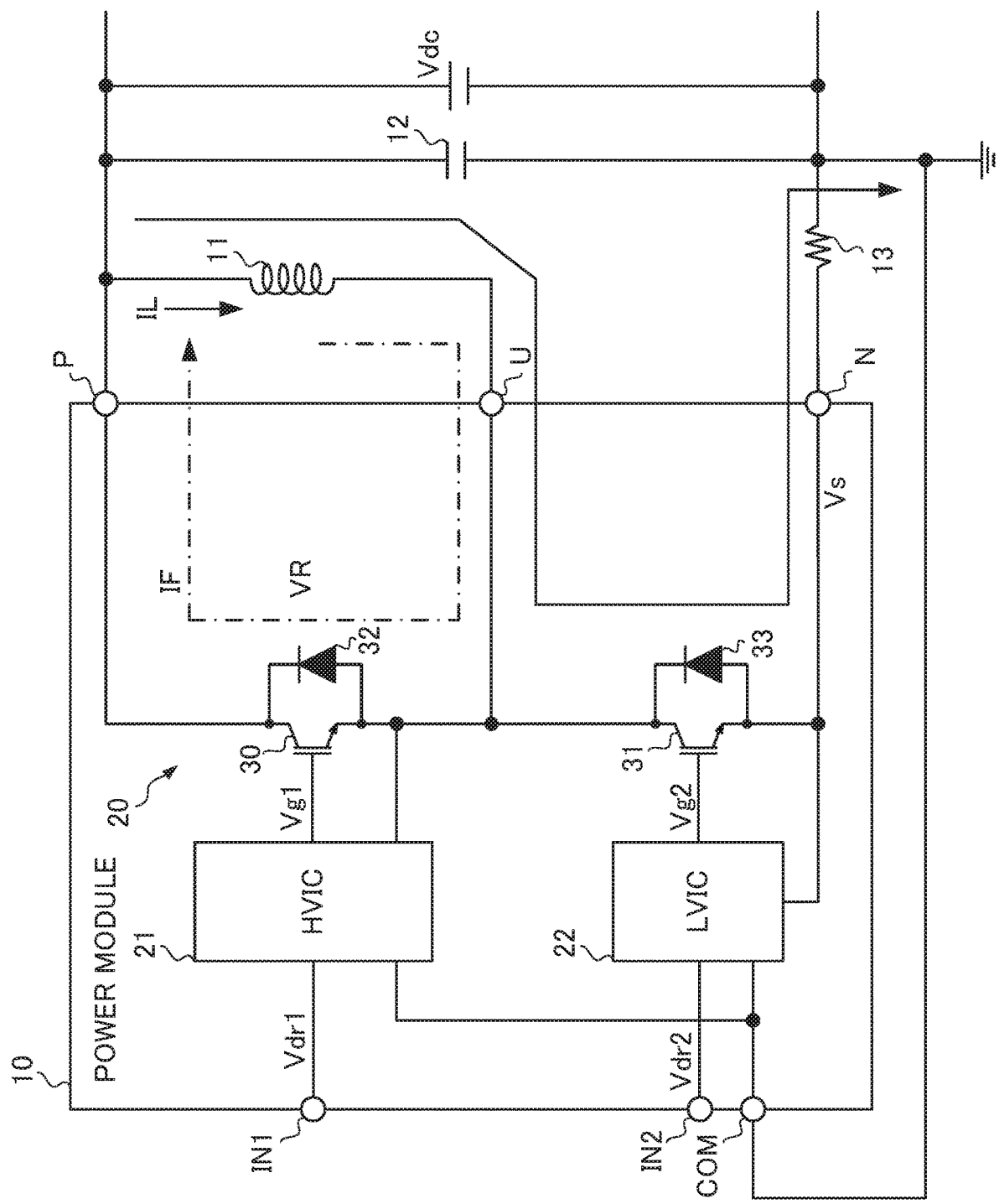
FIG. 1 is a diagram illustrating one example of a power module 10.

FIG. 1 illustrates a configuration of a power module 10 according to an embodiment of the present disclosure. The power module 10 is a semiconductor device that includes a power semiconductor for power conversion and a drive circuit that drives an inductor 11, for example. The power module 10 includes a half-bridge circuit 20, a High Voltage Integrated Circuit (HVIC) 21, a Low Voltage Integrated Circuit (LVIC) 22, and terminals IN1, IN2, COM, P, U, and N.

The half-bridge circuit 20 comprises an Insulated Gate Bipolar Transistors (IGBTs) 30 and 31, and Free Wheeling Diodes (FWD) 32 and 33. Note that the half-bridge circuit 20 corresponds to a "switch circuit".

The IGBT 30 is an upper-arm switching device provided on the power supply side, and the IGBT 31 is a lower-arm switching device that is connected in series with the IGBT 30 and that is provided on the ground side. Note that, in an embodiment of the present disclosure, the gate voltage of the IGBT 30 is referred to as a "voltage Vg1", and the gate voltage of the IGBT 31 is referred to as a "voltage Vg2". Further, the IGBT 30 corresponds to a "first switching device", and the IGBT 31 corresponds to a "second switching device".

The FWD 32 is a free-wheeling diode that is connected in parallel with the IGBT 30 and causes the energy of the inductor 11 to flow back. The FWD 32 has a cathode connected to the collector of the IGBT 30 and an anode connected to the emitter of the IGBT 30.

The FWD 33 is a free-wheeling diode that is connected in parallel with the IGBT 31, and that has a cathode connected to the collector of the IGBT 31 and an anode connected to the emitter of the IGBT 31. Note that the FWD 32 corresponds to a "first free-wheeling diode", and the FWD 33 corresponds to a "second free-wheeling diode".

A power supply voltage Vdc is applied to the terminal P, and the inductor 11, which is a load, is provided between the terminal P and the terminal U. Accordingly, the inductor 11 and the half-bridge circuit 20 configure a chopper circuit. Note that the inductor 11 corresponds to a "load of the switch circuit".

A capacitor 12 for stabilizing the power supply voltage Vdc is connected between the terminal P and the terminal N, and a resistor 13 for detecting an inductor current IL of the inductor 11 is connected between the terminal N and ground. Note that, in an embodiment of the present disclosure, a voltage generated at the resistor 13 is referred to as a "voltage Vs", and the inductor current IL corresponds to a "load current".

Further, here, no load is connected between the terminal U and the terminal N, however, if an inductor is connected between the terminal U and the terminal N, the FWD 33 operates as a free-wheeling diode.

The HVIC 21 is an integrated circuit for performing switching of the upper-arm IGBT 30. The HVIC 21 performs switching of the IGBT 30 based on a drive signal Vdr1 that is input, via the terminal IN1, from a microcomputer (not illustrated), for example.

The LVIC 22 is an integrated circuit for performing switching of the lower-arm IGBT 31. The LVIC 22 performs switching of the IGBT 31 based on a drive signal Vdr2 that is input, via the terminal IN2, from a microcomputer (not illustrated), for example.

The terminal COM is a terminal to be applied with a ground voltage, and connected with a housing (not illustrated) of the power module 10 or the like, for example.

<<Waveforms of Reverse Bias Boltage of FWD 32>>

Here, change in the reverse bias voltage of the FWD 32 will be described with reference to FIGS. 2 and 3. Note that, in an embodiment of the present disclosure, the voltage at the cathode electrode with reference to the voltage at the anode electrode of the upper-arm FWD 32, that is, a voltage obtained by subtracting the voltage at the terminal U from the voltage at the terminal P is referred to as a "voltage VR". Accordingly, when the voltage VR is a "positive" voltage, the reverse bias voltage is applied to the FWD 32.

Here, a current flowing through the FWD 32 is referred to as a "current IF", and the direction in which the current flows through the FWD 32 in the forward direction is given as a "positive" direction. Further, it is assumed that the power supply voltage Vdc is, for example, "300 V", and, for example, the IGBT 31 is driven by an LVIC 25 illustrated in FIG. 4 instead of the LVIC 22 in FIG. 1 when FIGS. 2 and 3 are explained.

The LVIC 25 is a voltage-drive type drive circuit that applies a voltage of "0 V", "15 V" to the gate of the IGBT 31, and that comprises switches SW1 and SW2. Note that the switch SW1 is configured with, for example, a PMOS (P-type metal-oxide-semiconductor) transistor, and the switch SW2 is configured with, for example, an NMOS (N-type metal-oxide-semiconductor) transistor.

Then, for example, when the drive signal Vdr2 goes high (hereinafter, referred to as high), the switch SW1 is tuned on and the switch SW2 is turned off. As a result, a predetermined voltage Vcc (e.g., "15 V") is applied to the gate of the IGBT 31 through the on-resistance of the switch SW1.

In contrast, when the drive signal Vdr2 goes low (hereinafter, referred to as low), the switch SW1 is turned off and the switch SW2 is turned on. As a result, a ground voltage (here, "0 V") is applied to the gate of the IGBT 31 through the on-resistance of the switch SW1.

Figure 2:
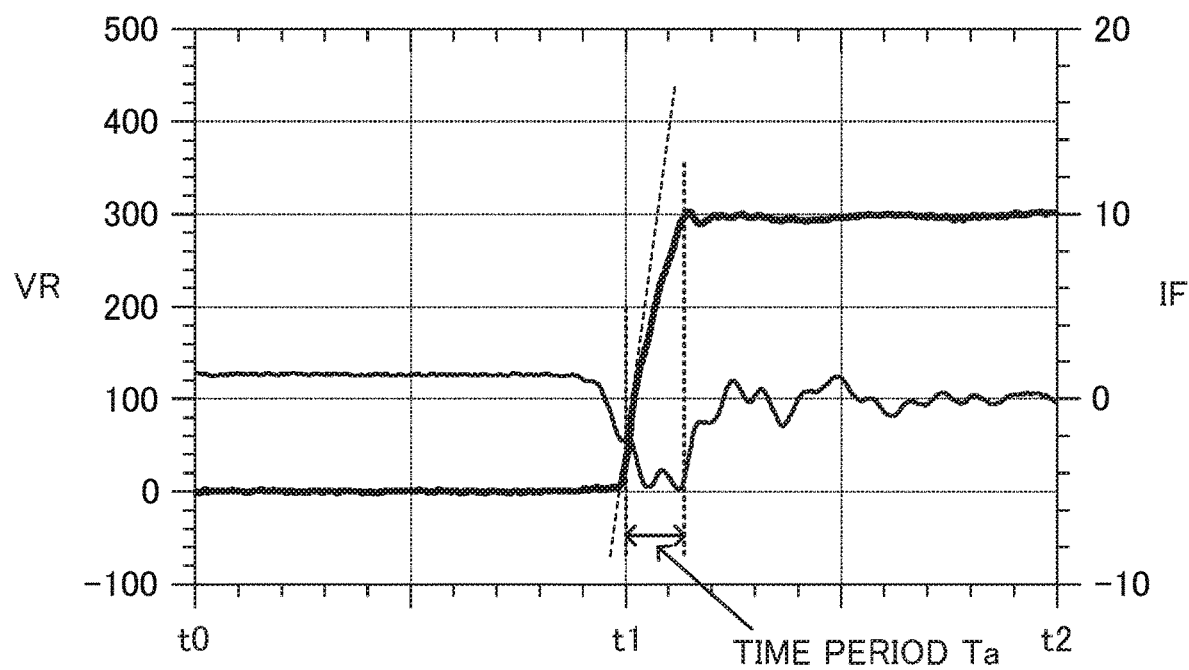
FIG. 2 is a diagram illustrating one example of waveforms of a voltage VR and a current IF.

FIG. 2 illustrates a diagram illustrating one example of the waveforms of the voltage VR when the current IF of the FWD 32 is small (e.g., 2 A). It is assumed here that the upper-arm IGBT 30 is kept "off" and the IGBT 31 is turned on at time t1.

First, both the IGBTs 30 and 31 are "off" from the time t0 to the time t1, and thus the inductor current IL flowing before the time t0 continues flowing through the FWD 32. Although not particularly illustrated in FIG. 1, for example, the FWD 32 and wiring have a resistance component. Accordingly, the current IF gradually decreases as approaching the time t1.

Then, for example, the IGBT 31 is turned "on" at the time t11, the current IF reaches substantially zero after the reverse recovery time period of the FWD 32 has elapsed. Further, at this time, the voltage VR rises to substantially "300 V" after a "time period Ta" has elapsed from the time t1. As a result, the FWD 32 is applied with a reverse bias voltage of "300 V" in the "time period Ta".

Figure 3:
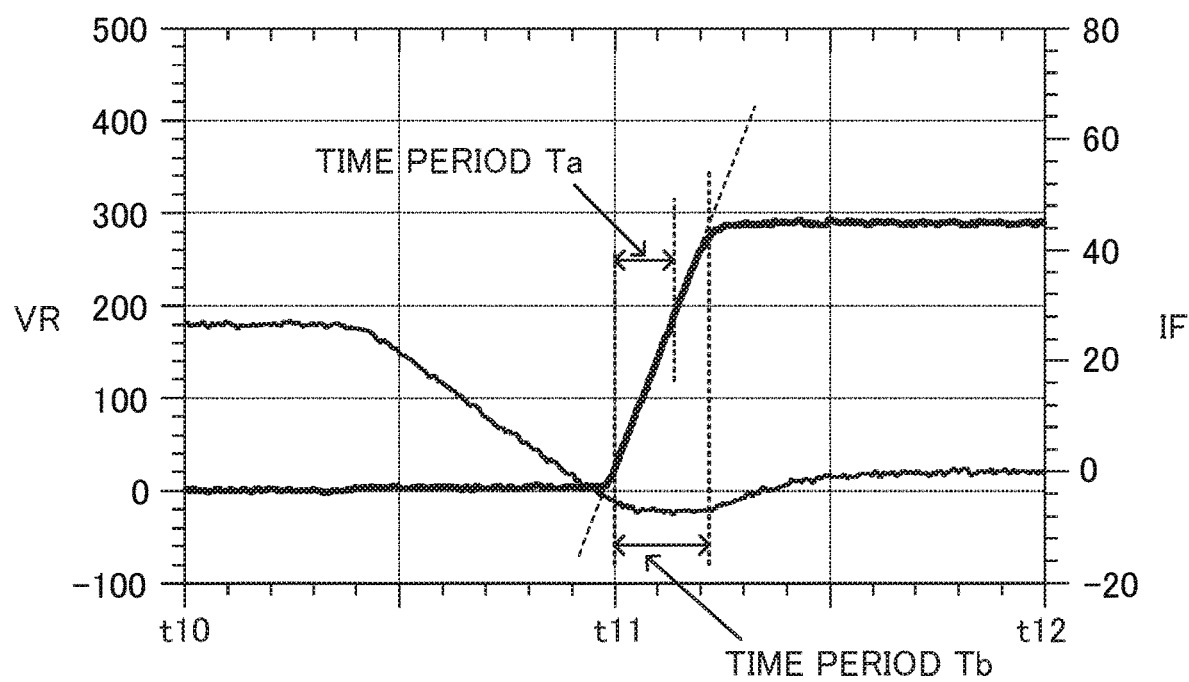
FIG. 3 is a diagram illustrating one example of waveforms of a voltage VR and a current IF.

FIG. 3 is a diagram illustrating one example of the waveforms of the voltage VR when the current IF of the FWD 32 is large (e.g., 28 A).

It is assumed here that the IGBT 30 is kept "off", and the IGBT 31 is turned "on" at the time t1, similarly to FIG. 2. Further, the lateral axis is the same between FIGS. 2 and 3, and thus a time period from the time t0 to time t2 is equal to a time period from the time t10 to time t12, and is, for example, 5 µs.

First, since both the IGBTs 30 and 31 are "off" from the time t10 to the time t11, the inductor current IL flowing before the time t10 flows through the FWD 32 as well as gradually decreases with time.

Then, for example, when the IGBT 31 is turned "on" at the time t11, the current IF reaches substantially zero after the reverse recovery time period of the FWD 32 has elapsed. Further, at this time, the voltage VR rises to substantially "300 V" after a "time period Tb" has elapsed from the time t11. As a result, the FWD 32 is applied with the reverse bias voltage of "300 V" in the "time period Tb".

Here, when the "time period Ta", which is the rise time of the voltage VR in FIG. 2, is compared with the "time period Tb", which is the rise time of the voltage VR in FIG. 3, the "time period Tb" is longer than the "time period Ta". Accordingly, when the inductor current IL decreases, the rise time of the voltage VR decreases, and when the inductor current IL increases, the rise time of the voltage VR increases. This is because, for example, the smaller the inductor current IL is and the smaller the carrier density in the FWD 32 is, the faster a depletion layer spreads, while the larger the inductor current IL is and the larger the carrier density in the FWD 32 is, the more slowly the depletion layer spreads.

Figure 5:
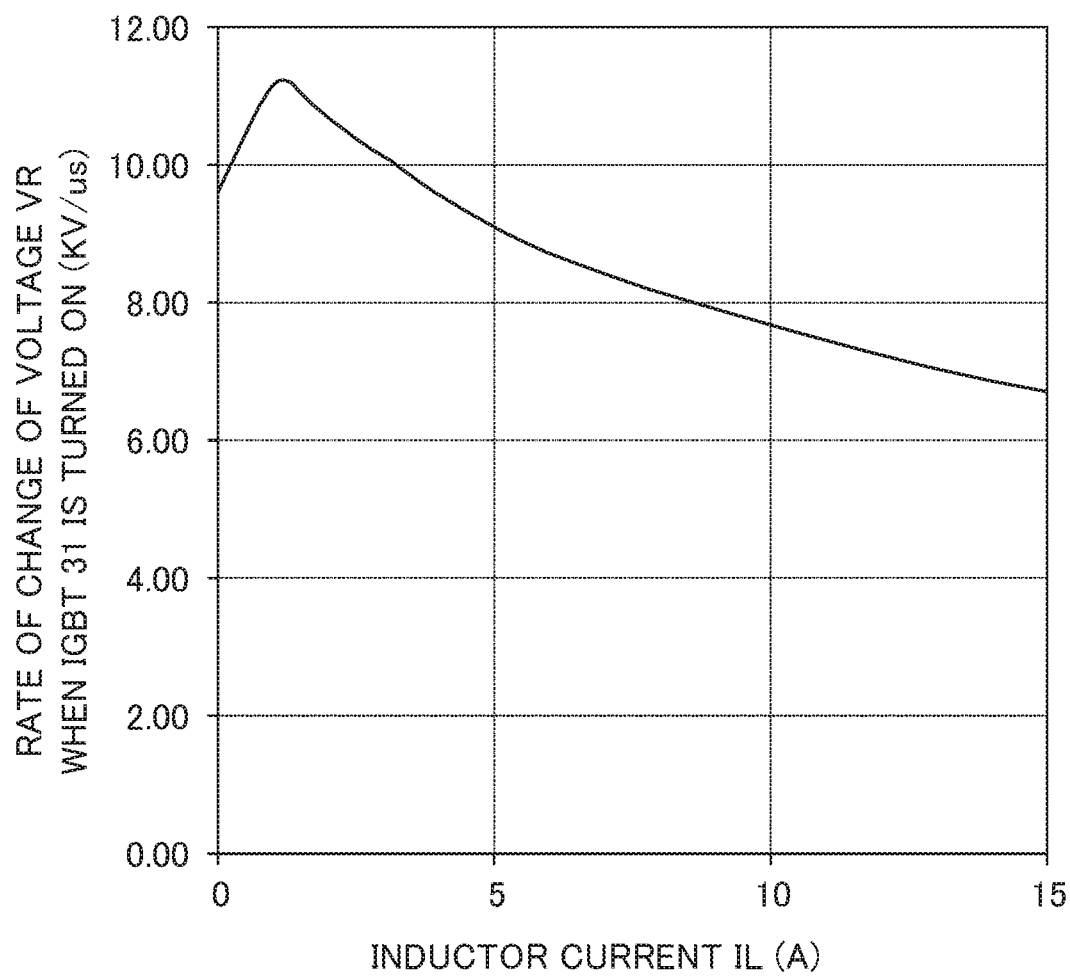
FIG. 5 is a diagram illustrating a relationship between an inductor current IL and a rate of change of a voltage VR.

FIG. 5 is a diagram illustrating a relationship between the rate of change of the voltage VR when rising and the inductor current IL when the LVIC 25 is used. Note that the "rate of change of the voltage VR when rising" means the rate expressing a change in the rise time of the voltage VR, and is obtained by dividing "300 V", which is a value when the voltage VR has risen, by a time period during which the voltage VR changes from "0 V" to "300 V", for example.

Figure 4:
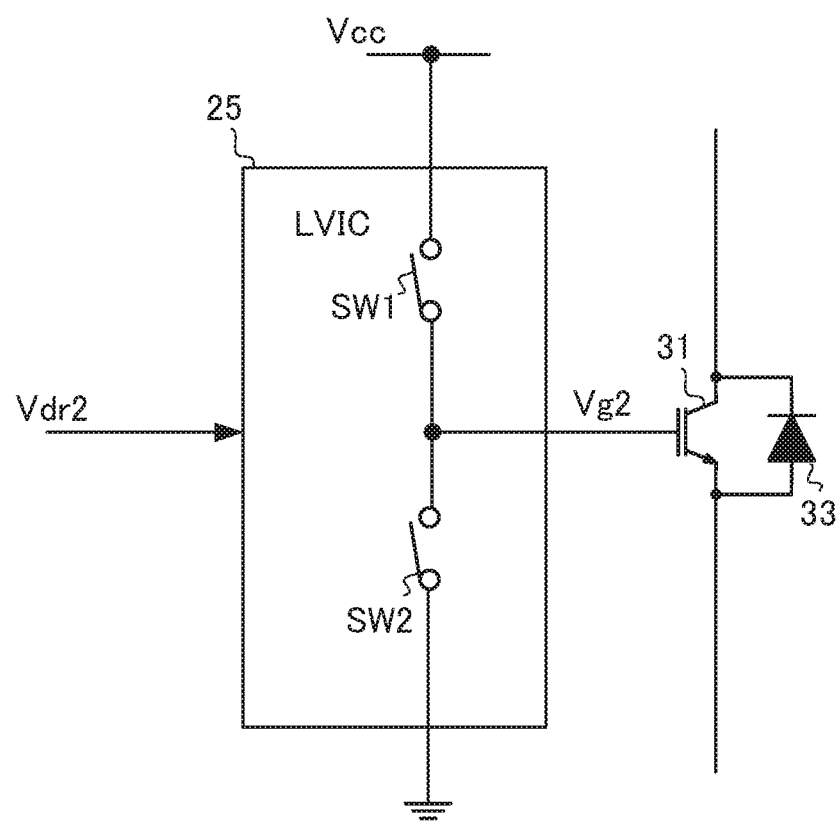
FIG. 4 is a diagram illustrating one example of an LVIC 25.

As illustrated in FIG. 5, the rate of change of the voltage VR when rising tends to decrease when the inductor current IL increases. Accordingly, in the case where the common voltage-drive type LVIC 25 illustrated in FIG. 4 is used, the smaller the inductor current IL is, the larger the noise generated via the inductor 11 and the capacitor 12 is when the IGBT 31 is turned on.

In order to remove such noise, the LVIC 22 illustrated in FIG. 1 turns on the IGBT 31 over a long time period when the inductor current IL is small.

Accordingly, even if the inductor current IL is small and the voltage VR rises in a short time period, an abrupt change in the voltage VR can be suppressed by increasing the time period over which the IGBT 31 is turned on. Further, when the inductor current IL is large and the rise time of the voltage VR is long, the rise time of the voltage VR can be prevented from increasing more than necessary by reducing the time period over which the IGBT 31 is turned on.

<<<Configuration of LVIC 22>>>

Figure 6:
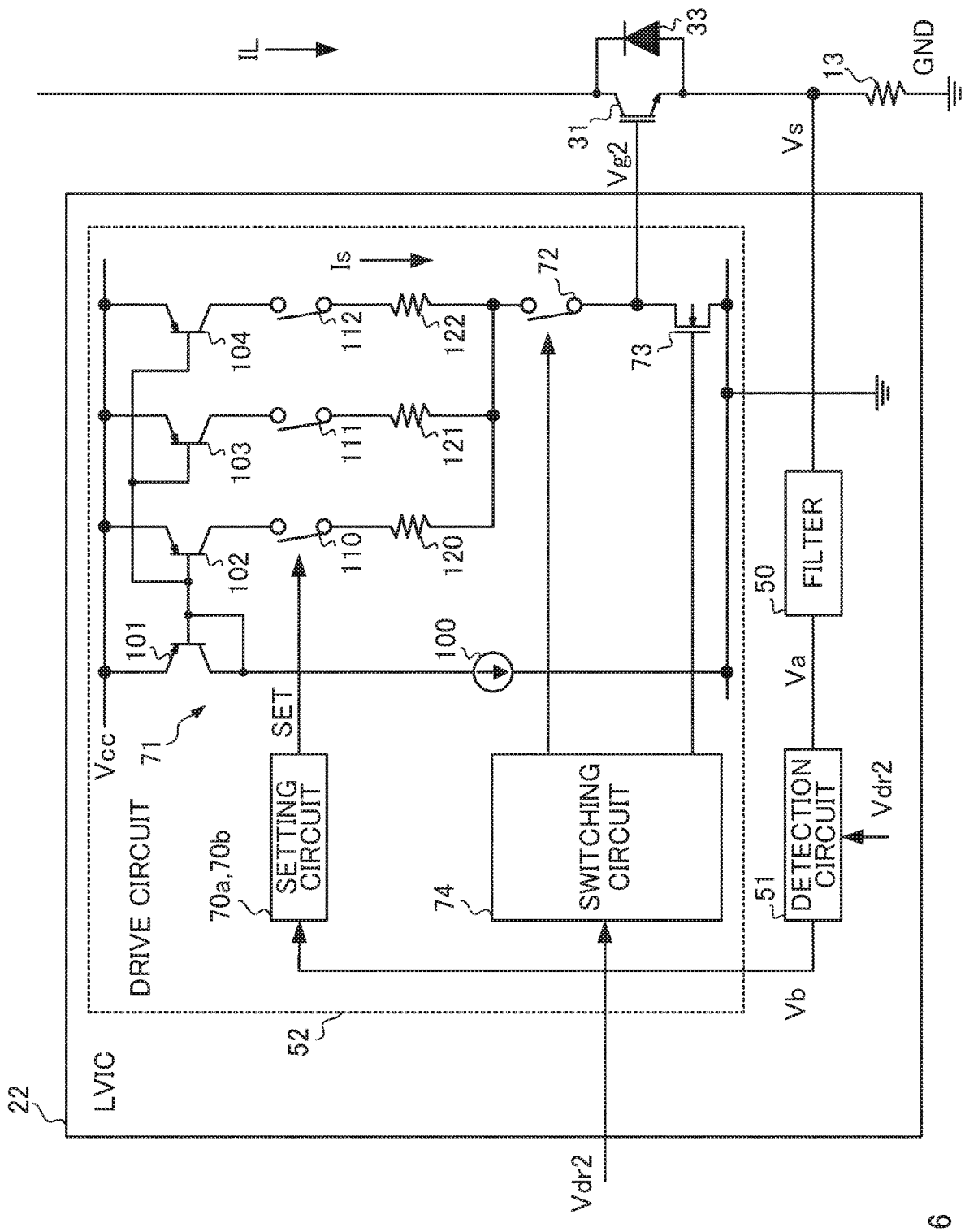
FIG. 6 is a diagram illustrating one example of an LVIC 22.

FIG. 6 is a diagram illustrating one example of a configuration of the LVIC 22. The LVIC 22 is an integrated circuit that turns on and off the IGBT 31 based on the drive signal Vdr2 while preventing an abrupt change in the reverse bias voltage VR of the FWD 32. The LVIC 22 comprises a filter 50, a detection circuit 51, and a drive circuit 52.

The filter 50 is a circuit that reduces noise in the voltage Vs corresponding to the inductor current IL, and outputs the result as a voltage Va. For example, the filter 50 is a low-pass filter including a resistor and a capacitor (not illustrated). Thus, the filter 50 suppresses noise having a frequency higher than the switching frequency of the IGBT 31 in the noise in the voltage Vs.

The detection circuit 51 is a circuit that obtains the voltage Va output from the filter 50 based on the drive signal Vdr2. Since the voltage Va corresponds to the voltage Vs with its noise removed, the detection circuit 51 results in detecting the inductor current IL as a voltage. Note that the detection circuit 51 will be described later in detail.

The drive circuit 52 turns on the IGBT 31 in a time period corresponding to the detection result of the detection circuit 51 when the drive signal Vdr2 is high, and turns off the IGBT 31 when the drive signal Vdr2 is low. Note that "high" corresponds to "one logic level", and "low" corresponds to "another logic level".

<<Details of Detection Circuit 51>>

Figure 7:
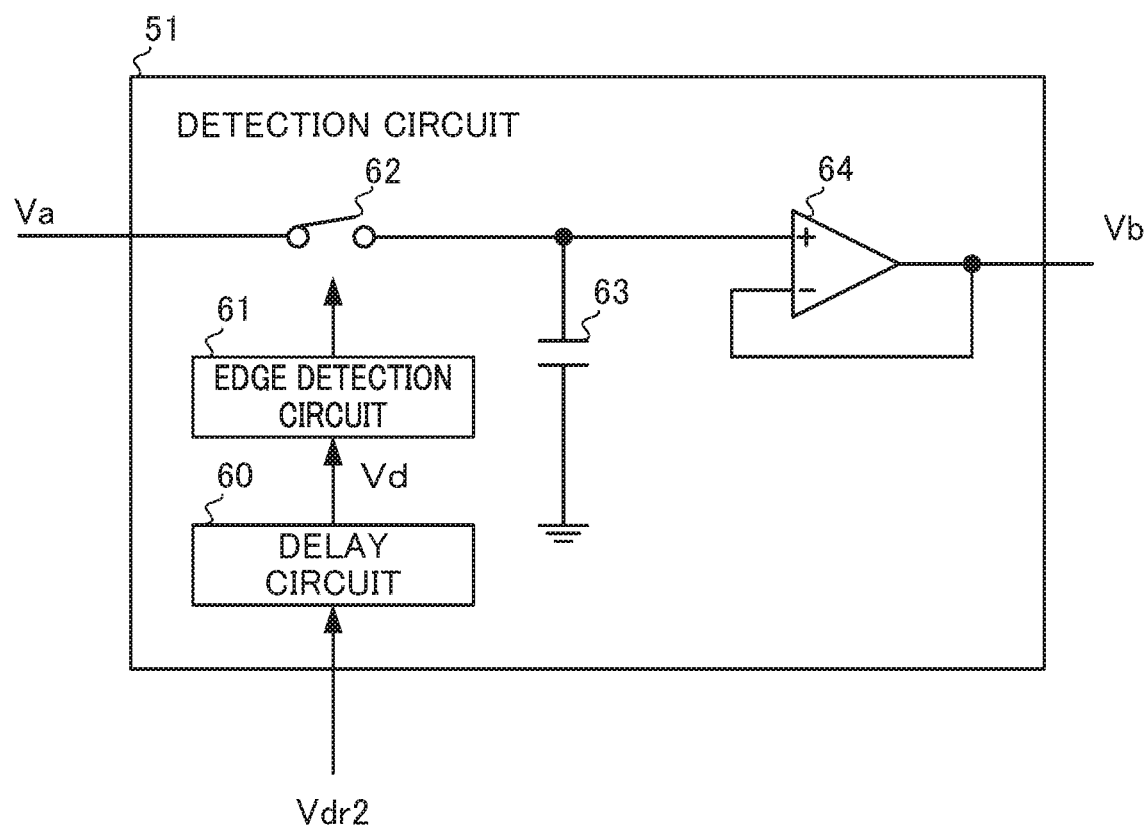
FIG. 7 is a diagram illustrating one example of a detection circuit 51.

FIG. 7 is a diagram illustrating one example of a configuration of the detection circuit 51. The detection circuit 51 is a sample hold circuit that samples and holds the voltage Va based on the drive signal Vdr2, and comprises a delay circuit 60, an edge detection circuit 61, a switch 62, a capacitor 63, and a unity gain buffer 64.

The delay circuit 60 and the edge detection circuit 61 are circuits that generate timing for sampling the voltage Va. Specifically, the delay circuit 60 delays the drive signal Vdr2 by a "predetermined time period Tx", and outputs the result as a signal Vd. Note that the "predetermined time period Tx", by which the drive signal Vdr2 is delayed in the delay circuit 60, is, for example, a time period from a time when the drive signal Vdr2 goes low so as to turn off the IGBT 31 to a time when the IGBT 31 is actually turned off. Although the details will be described later, the detection circuit 51 can obtain the maximum value of the inductor current IL by sampling the current of the IGBT 31 at such timing.

The edge detection circuit 61 detects the falling edge of the signal Vd and outputs a pulse signal Vp to the switch 62.

The switch 62 has one end applied with the voltage Va, and is "on" only during a time period during which the pulse signal Vp is input. As a result, when the switch 62 is turned "on", the voltage of the capacitor 63 results in the voltage Va.

The unity gain buffer 64 is a buffer circuit that outputs the voltage of the capacitor 63 as a voltage Vb.

Figure 8:
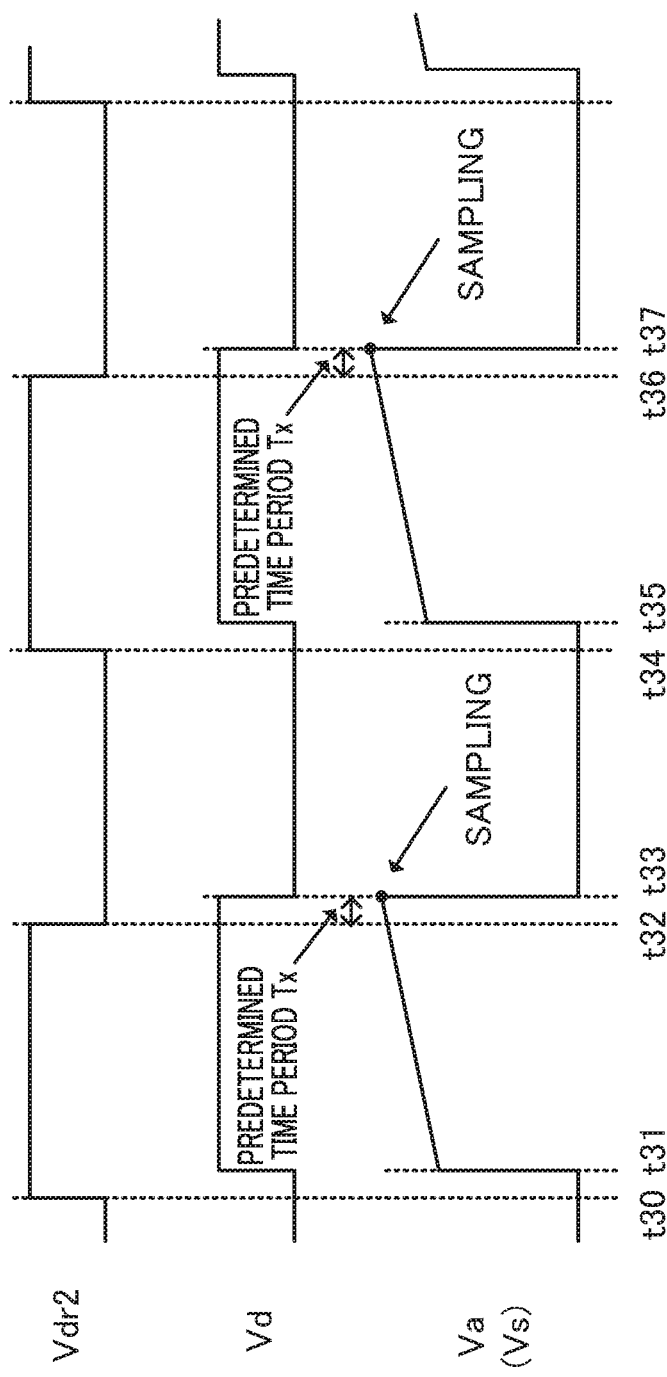
FIG. 8 is a diagram for explaining an operation of a detection circuit 51.

FIG. 8 is a diagram for explaining an operation of the detection circuit 51. Hereinafter, in an embodiment of the present disclosure, a description will be given using the voltage Vs with its noise component omitted, for convenience, and thus the voltage Vs results in being equivalent to the voltage Va.

When the drive signal Vdr2 goes high at time t30, for example, the drive circuit 52 turns "on" the IGBT 31, for example, at time t31. As a result, the inductor current IL flowing through the inductor 11 gradually increases, and thus the voltage Va (=Vs) increases at the time t31 and thereafter.

Then, when the drive signal Vdr2 goes low at time t32, the signal Vd also goes low at time t33, which is delayed by the "predetermined time period Tx" from the time t32. As a result, the pulse signal Vp is output, and thus the switch 62 is turned "on" and the voltage Va is sampled.

Here, the time t33 corresponds to a timing at which the IGBT is turned off. Thus, the current value of the inductor current IL is maximum. Accordingly, the capacitor 63 holds a voltage value indicative of the peak current of the IGBT 31 when the IGBT 31 is on. Note that, from time t34 to time t37 following the time t33, the operation from the time t30 to t33 is repeated.

Accordingly, the detection circuit 51 detects and holds the peak current flowing through the IGBT 31 every time when the IGBT 31 is turned on. Note that the current flowing through the IGBT 31 when the IGBT 31 is turned on is the same as the inductor current IL. Thus, the detection circuit 51 results in detecting the peak value of the inductor current IL of the inductor 11 which is a load, every time when the IGBT 31 is turned on.

<<Details of Drive Circuit 52>>

The drive circuit 52 is a circuit that charges the gate capacitance of the IGBT 31 with a "source current Is" (described later) corresponding to the magnitude of the inductor current IL when the IGBT 31 is turned on, and applies a predetermined voltage to the gate of the IGBT 31 when the IGBT 31 is turned off. That is, the drive circuit 52 drives the IGBT 31 using a current, when the IGBT 31 is turned on, and drives the IGBT 31 using a voltage, when the IGBT 31 is turned off. Note that the gate of the IGBT 31 corresponds to a "control electrode", and the gate capacitance of the IGBT 31 corresponds to a "gate capacitance of the second switching device".

As illustrated in FIG. 6, the drive circuit 52 comprises a setting circuit 70a, a current generating circuit 71, a switch 72, an NMOS transistor 73, and a switching circuit 74.

The setting circuit 70a is a circuit that sets a current value of the source current Is that the current generating circuit 71 (described later) generates based on the detection result of the detection circuit 51. Specifically, the setting circuit 70a outputs, to the current generating circuit 71, a setting data SET for increasing the source current Is according to an increase in the voltage Vb. Note that the setting data SET is, for example, 3-bit data. Further, although the setting circuit 70a is used here, a setting circuit 70b, which will be described later, may be used instead of the setting circuit 70a.

The current generating circuit 71 is a circuit that generates the source current Is based on the setting data SET, and comprises a current source 100, PNP transistors 101 to 104, switches 110 to 112, and resistors 120 to 122.

The current source 100 generates a predetermined sink current, and the PNP transistor 101 and the PNP transistors 102 to 104 configure a current mirror circuit.

The switches 110 to 112 correspond to a switch group that is turned on and off according to the setting data SET, and the resistors 120 to 122 are respectively provided between the switches 110 to 112 and the switch 72. In an embodiment of the present disclosure, currents flowing from the PNP transistors 102 to 104 result in the "source current Is".

When the inductor current IL is small, for example, "1 A", the voltage Vb is also small, and thus, for example, only the switch 110 out of the switches 110 to 112 is turned on. Then, when the inductor current IL increases from "1 A" and reaches, for example, "5 A", the voltage Vb increases. As a result, for example, the switches 110 and 111 out of the switches 110 to 112 are turned on. Accordingly, the current generating circuit 71 generates the source current Is that increases with an increase in the inductor current IL or decreases with a decrease in the inductor current IL.

The switch 72 is an element for supplying the source current Is to the gate of the IGBT 31 when the IGBT 31 is turned on. The NMOS transistor 73 is a device for applying a ground voltage ("0 V") to the gate of the IGBT 31 when the IGBT 31 is turned off. Note that the NMOS transistor 73 according to an embodiment of the present disclosure is designed such that the on-resistance thereof is sufficiently small. Thus, when the NMOS transistor 73 is turned on, the gate capacitance of the IGBT 31 is discharged in a short time period. Note that the switch 72 corresponds to a "first switch", and the NMOS transistor 73 corresponds to a "second switch".

When the drive signal Vdr2 is high so as to turn on the IGBT 31, the switching circuit 74 turns "on" the switch 72 and turns "off" the NMOS transistor 73. As a result, "the source current Is" is supplied to the gate of the IGBT 31, so that the IGBT 31 is turned "on".

Further, when the drive signal Vdr2 is low so as to turn "off" the IGBT 31, the switching circuit 74 turns "off" the switch 72 and turns "on" the NMOS transistor 73. As a result, the gate capacitance of the IGBT 31 is discharged, so that the IGBT 31 is tuned "off". Accordingly, the switching circuit 74 turns off the IGBT 31 irrespective of the inductor current IL.

<<<Waveforms when IGBT 31 is Turned "on">>>

Figure 9:
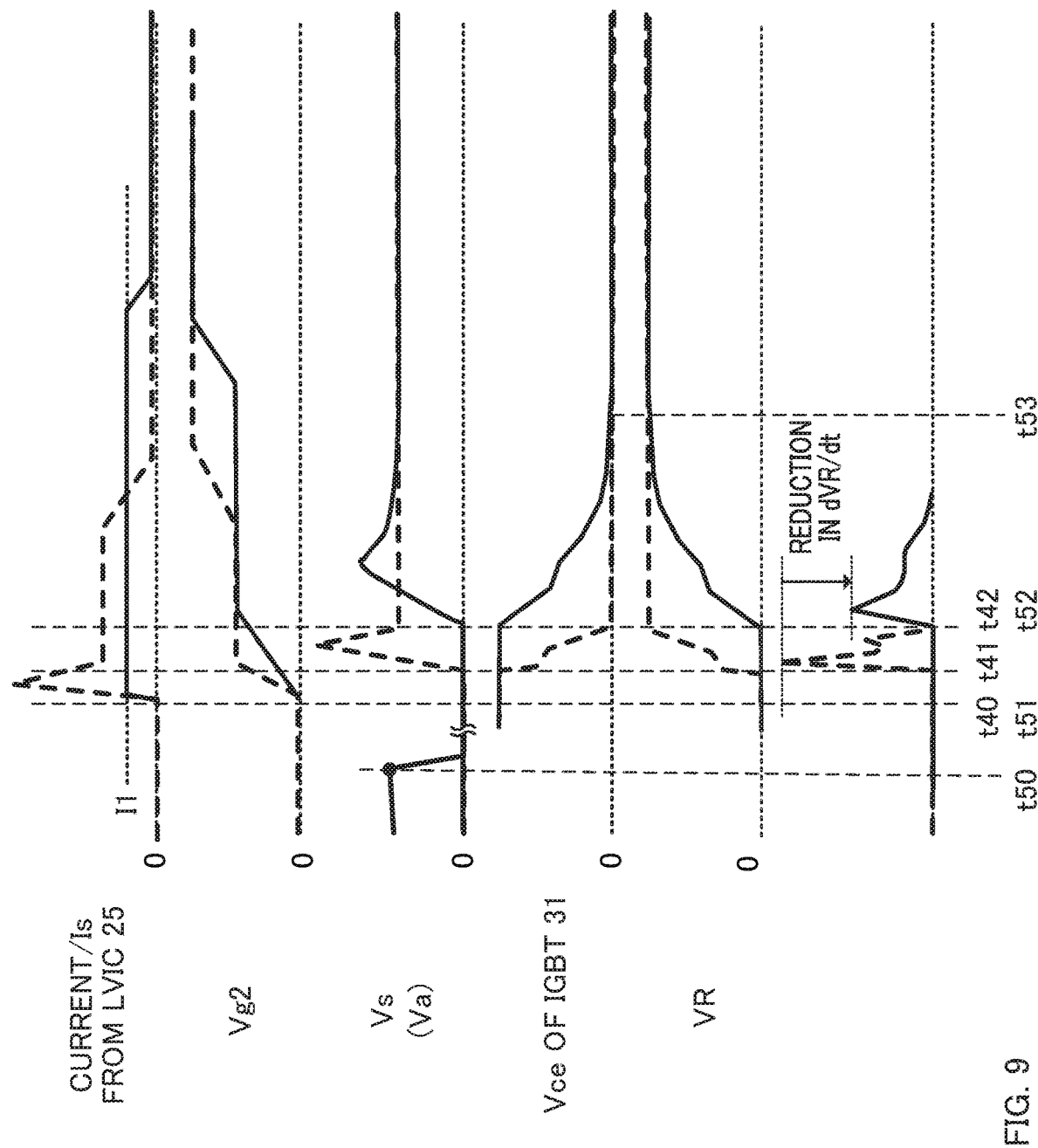

FIG. 9 is a diagram illustrating one example of the waveforms at main nodes when the IGBT 31 is turned "on". Note that, in FIG. 8, "dashed lines" are one example of the waveforms when the IGBT 31 is turned "on" using the LVIC 25 illustrated in FIG. 4 instead of the LVIC 22, and "solid lines" are one example of the waveforms when the IGBT 31 is turned "on" using the LVIC 22.

<<When LVIC 25 Turns "on" IGBT 31 (Dashed Line)>>

First, a description will be given of the waveforms (here, the waveforms of the "dashed lines") at the main nodes when the common voltage-drive type LVIC 25 turns on the IGBT 31 at time t40 from a condition where both the IGBTs 30 and 31 are "off".

When the switch SW1 is turned on at the time t40, the voltage Vcc (for example, "15 V") is applied to the gate of the IGBT 31 through the on-resistance of the switch SW1. As a result, inrush current flows to the gate of the IGBT 31 and the gate capacitance is charged.

Then, when the voltage Vg2 rises, the difference between the voltage Vcc and the voltage Vg2 becomes smaller, and thus the current supplied from the LVIC 25 to the gate of the IGBT 31 decreases. However, since the gate capacitance of the IGBT 31 is charged during this time period, the voltage Vg2 rises.

When the IGBT 31 is turned "on" at time t41, the inductor current IL increases, and thus the voltage Vs rises. At this time, a voltage Vce across the emitter and collector of the IGBT 31 drops from the time t41 to substantially "0 V" at the time t42.

Further, at this time, the voltage VR of the upper-arm FWD 32 illustrated in FIG. 1 results in VR=Vdc−Vce. Accordingly, from the time t41 when the IGBT 31 is turned "on", the voltage VR rises with a drop in the voltage Vce, to substantially the voltage Vdc (="300 V") at the time t42. Thus, here, the voltage VR rises from the time t41 to the time t42.

<<When LVIC 22 Turns "on" IGBT 31 (Solid Line)>>

Next, a description will be given of the waveforms (here, the waveforms of the "solid lines") at the main nodes when the LVIC 22 turns "on" the IGBT 31 at time t51 from a condition where both the IGBTs 30 and 31 are "off".

Note that time t50, which is followed by the time t51, is a timing at which the "predetermined time period Tx" has elapsed since the drive signal Vdr2 (not illustrated in FIG. 8) has gone low so as to turn "off" the IGBT 31. Accordingly, at the time t50, the detection circuit 51 holds the voltage Va that corresponds to the peak of the inductor current IL before the IGBT 31 is turned "off". It is assumed here that the peak of the inductor current IL at the time t50 is a "current value I0".

Then, the setting circuit 70a outputs the setting data SET corresponding to the "current value I0" at the time t50. Accordingly, the current generating circuit 71 generates the source current Is corresponding to the "current value I0", if the switch 72 is turned on. Note that, at this timing, the source current Is is not generated since the switch 72 is off, and thus the source current Is is not supplied to the gate of the IGBT 31.

When the drive signal Vdr2 (not illustrated in FIG. 9) goes high so as to turn "on" the IGBT 31, the switching circuit 74 turns "on" the switch 72 at the time t51 and turns "off" the NMOS transistor 73. As a result, the predetermined source current Is corresponding to the "current value I0" is supplied to the gate of the IGTB31. It is assumed here that the predetermined source current Is is a "current value I1".

Then, since the gate capacitance of the IGTB31 is charged with the source current Is of the "current value I1", the gate voltage Vg2 gradually increases. When the IGBT 31 is turned "on" at the time t52, the inductor current IL increases and the voltage Vs rises. At this time, the voltage Vce across the emitter and collector of the IGBT 31 slowly drops from the time t52 to substantially "0 V" at time t53.

Further, the voltage VR at the upper-arm FWD 32 illustrated in FIG. 1 results in VR=Vdc−Vce. Accordingly, from the time t52 when the IGBT 31 is turned "on", the voltage VR slowly rises with a drop in the voltage Vce, to substantially the voltage Vdc (="300 V") at the time t53.

Here, in the case where the common voltage-drive type LVIC 25 is used, as illustrated in the "dashed lines", the voltage VR rises in a time period from the time t41 to the time t42. Whereas, in the case where the LVIC 22 according to an embodiment of the present disclosure is used, the voltage VR rises in a time period from the time t52 to the time t53. The time period from the time t52 to the time t53 is longer than the time period from the time t41 to the time t42. Accordingly, as illustrated in the lowest one of FIG. 9, with the use of the LVIC 25, an abrupt change in the voltage VR can be reduced more, which suppresses the generation of noise.

Incidentally, as described with reference to FIGS. 2 and 3, when the inductor current IL decreases, the carrier density in the FWD 32 decreases, and thus a depletion layer of the FWD 32 spreads faster. Accordingly, in general, when the inductor current IL decreases, the rise time of the voltage VR decreases, which increases noise.

However, when the inductor current IL decreases, for example, the peak current of the IGBT 31 at the time t50 decreases to be smaller than the "current value I0". Accordingly, the voltage Va sampled at the time t50 decreases as well.

In such a case, the current value of the source current Is results in being smaller than the "current value I1", and thus a time period during which the gate capacitance of the IGBT 31 is charged increases. Accordingly, in an embodiment of the present disclosure, even when the inductor current IL is small, it is possible to prevent the voltage VR from abruptly changing.

Further, when the inductor current IL increases, the carrier density in the FWD 32 increases, and thus the depletion layer in the FWD 32 spreads slowly. At this time, the rise time of the voltage VR may increases more than necessary and the switching efficiency may be reduced.

However, in an embodiment of the present disclosure, the current value of the source current Is increases with an increase in the inductor current IL, and a time period during which the gate capacitance of the IGBT 31 is charged decreases. Thus, the drive circuit 52 can prevent the rise time of the voltage VR from increasing more than necessary.

《Comparison Between LVIC 22 and LVIC 25》

Figure 10:
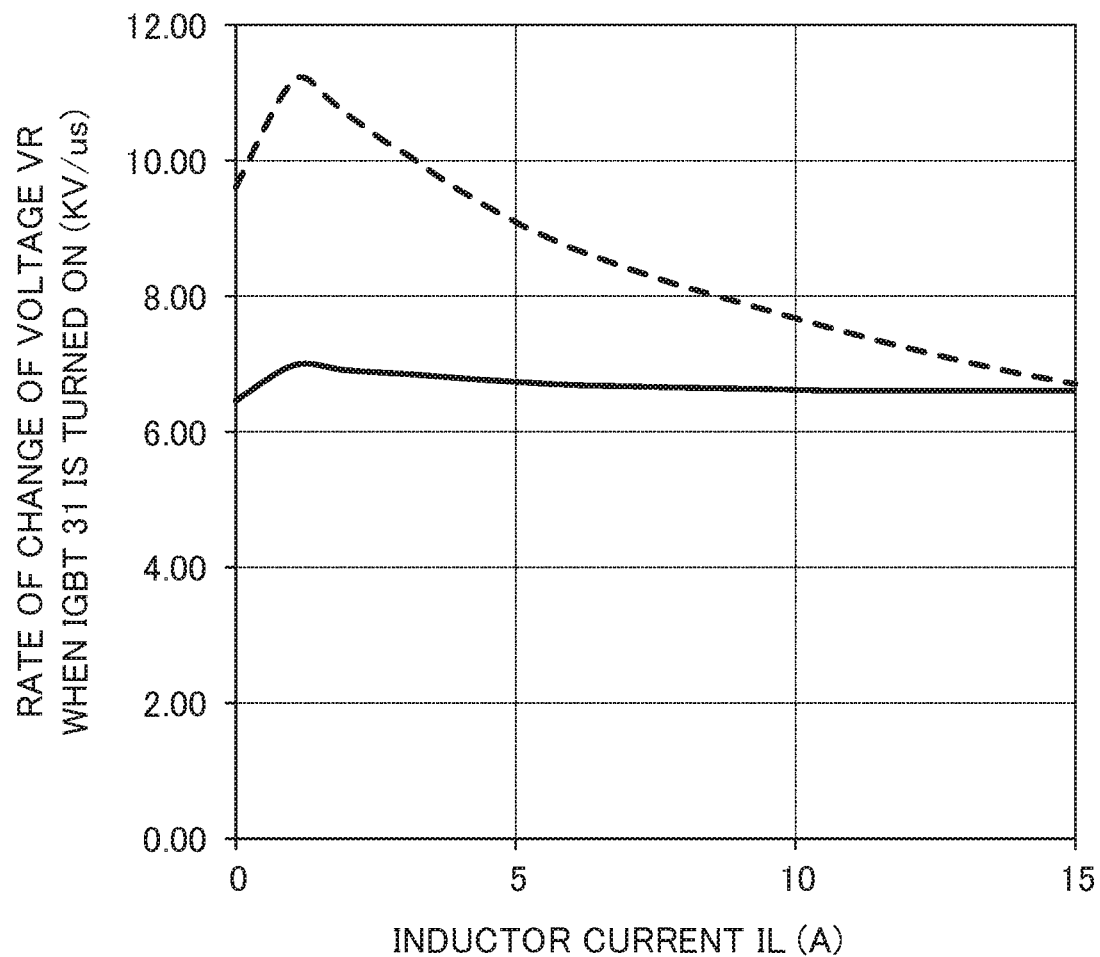
FIG. 10 is a diagram illustrating a relationship between an inductor current IL and a rate of change of a voltage VR.

FIG. 10 is a diagram illustrating a relationship between the inductor current IL and the rate of change of the voltage VR. Note that the "solid line" in FIG. 10 is one example when the LVIC 22 turns "on" the IGBT 31, and the "dashed line" is one example when the LVIC 25 turns "on" the IGBT 31.

As such, as compared with the case where the common voltage-drive type LVIC 25 is used to turn on the IGBT 31, the use of the LVIC 22 according to an embodiment of the present disclosure can reduce the rate of change of the voltage VR, which is the reverse bias voltage of the FWD 32. As a result, the LVIC 22 can reduce noise caused by the voltage VR. Further, the LVIC 22 can maintain the voltage VR substantially constant even when the inductor current IL changes.

Other Embodiments

==Another Embodiment of Setting Circuit==

Figure 11:
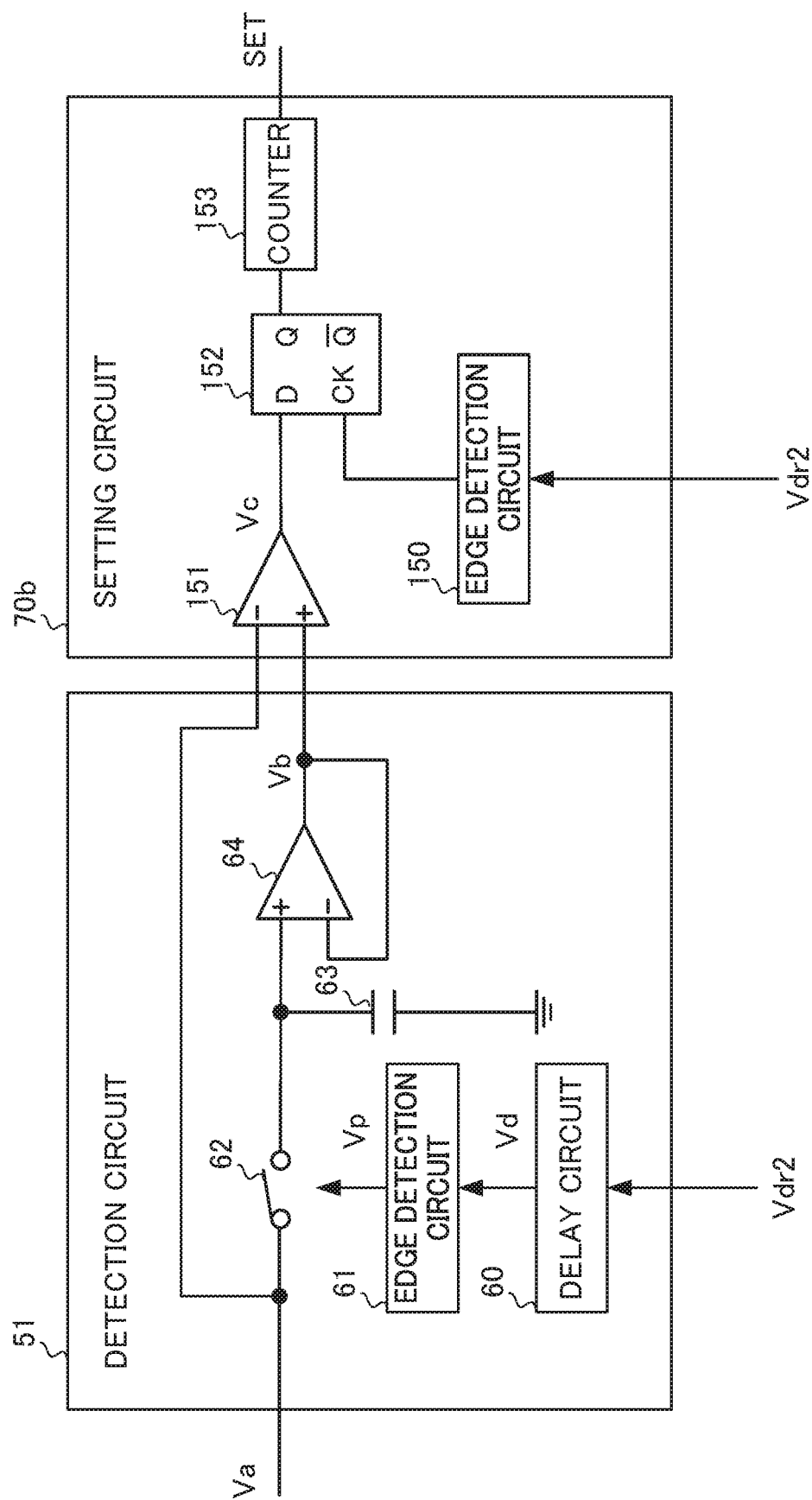
FIG. 11 is a diagram illustrating one example of a detection circuit 51 and a setting circuit 70b.

FIG. 11 is a diagram illustrating one example of the setting circuit 70b. The setting circuit 70b is also a circuit that sets the current value of the source current Is that the current generating circuit 71 generates based on the detection result of the detection circuit 51, similarly to the setting circuit 70a. Specifically, the setting circuit 70b compares the voltage Vb sampled and held in the detection circuit 51 with the voltage Va obtained in the next sampling time period, and changes the source current Is based on the comparison result.

The setting circuit 70b comprises an edge detection circuit 150, a comparator 151, a D flip-flop 152, and a counter 153.

The edge detection circuit 150 detects the falling edge of the drive signal Vdr2 and outputs a pulse signal.

The comparator 151 (comparison circuit) compares the voltage Vb sampled and held in the detection circuit 51 with the voltage Va obtained in the next sampling time period. The comparator 151 outputs a low comparison result Vc when the voltage Va is lower than the voltage Vb, and outputs a high comparison result Vc when the voltage Va is higher than the voltage Vb. In FIG. 8, the comparator 151 compares, for example, the voltage Vb sampled and held at the time t33 with the voltage Va.

The D flip-flop 152 (holding circuit) holds the comparison result Vc of the comparator 151 at a timing at which the drive signal Vdr2 goes low based on the pulse signal from the edge detection circuit 150. For example, the D flip-flop 152 holds, at time t36, the comparison result Vc between the voltage Va and the voltage Vb held at the time t33.

The counter 153 is a circuit that changes a count value, which corresponds to the foregoing "setting data SET", based on the comparison result Vc. Specifically, the counter 153 changes a count value (i.e., the "setting data SET") so as to increase the source current Is when the comparison result Vc is high, that is, when the inductor current IL increases. Further, the counter 153 changes a count value so as to decrease the source current Is when the comparison result Vc is low, that is, the inductor current IL decreases. Note that an initial value is set in the counter 153 such that the predetermined source current Is is generated. Even when the setting circuit 70b as such is used instead of the setting circuit 70a, it is possible to produce an effect similar to that in the case where the setting circuit 70a is used.

Note that the timing at which the IGBT 31 is turned off, that is, the timing at which the signal Vd goes low (for example, the time t33 in FIG. 8) corresponds to a "first timing", and the timing at which the drive signal Vdr2 goes low (for example, the time t36 in FIG. 8) corresponds to a "second timing".

Further, the voltage Va corresponding to the inductor current IL corresponds to a "first voltage", and the voltage Vb corresponds to a "second voltage".

==Power Module 200==

Figure 12:
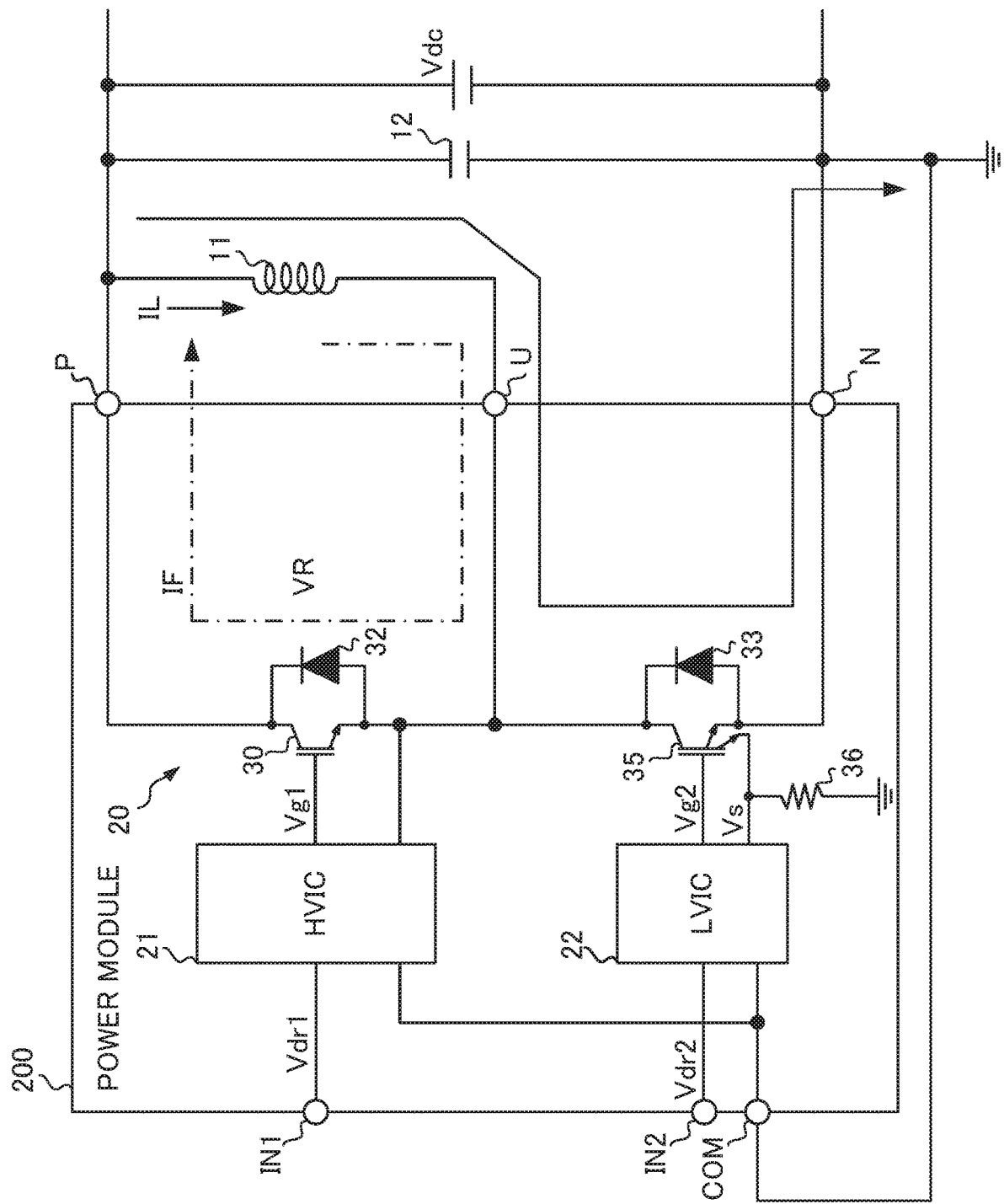
FIG. 12 is a diagram illustrating one example of a power module 200.

FIG. 12 is a diagram illustrating one example of a power module 200. In the power module 200, an IGBT 35 is used instead of the IGBT 31 of the power module 10 in FIG. 1, and a resistor 36 is used instead of the resistor 13. Note that the blocks given the same reference numerals are the same between FIG. 1 and FIG. 12.

The IGBT 35 includes an IGBT having a large size for controlling the inductor current IL, and an IGBT having a small size for performing current detection, and a current from the IGBT for current detection is supplied to the resistor 36. Accordingly, even in the case where the IGBT 35 is used, the inductor current IL which is a load and the voltage Vs corresponding to the current flowing through the IGBT 35 are generated at the resistor 36. As a result, the detection circuit 51 of the power module 200 can detect the inductor current IL, and thus the power module 200 has effects similar to those of the power module 10.

==Power Module 210==

Figure 13:
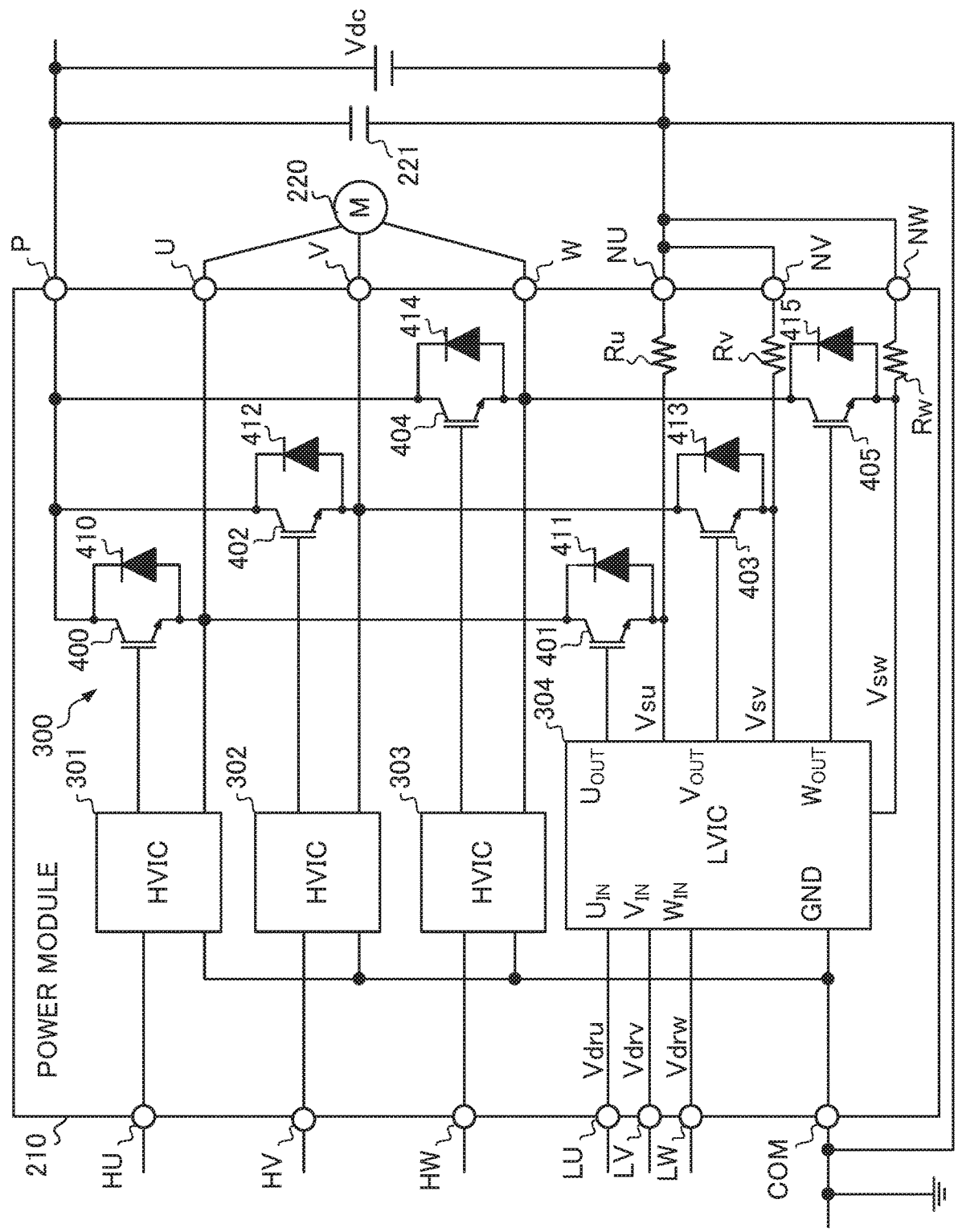
FIG. 13 is a diagram illustrating one example of a power module 210.

FIG. 13 is a diagram illustrating one example of a power module 210. The power module 210 is a semiconductor device that drives a three-phase motor 220, and comprises a bridge circuit 300 for power conversion, HVICs 301 to 303, an LVIC 304, and terminals HU, HV, HW, LU, LV, LW, P, U, V, W, NU, NV, and NW.

The bridge circuit 300 comprises IGBTs 400 to 405, FWDs 410 to 415, and resistors Ru, Rv, and Rw. Note that the bridge circuit 300 corresponds to the "switch circuit".

The IGBTs 400 and 401 are U-phase switching devices, and the IGBTs 400 and 401 are provided with the FWDs 410 and 411, respectively.

The IGBTs 402 and 403 are V-phase switching devices, and provided with the FWDs 412 and 413, respectively.

The IGBTs 404 and 405 are W-phase switching devices, and provided with the FWDs 414 and 415, respectively.

In an embodiment of the present disclosure, each of the IGBTs 400, 402, and 404 corresponds to the "first switching device", each of the IGBTs 401, 403, and 405 corresponds to the "second switching device". Further, each of the FWDs 410, 412, and 414 corresponds to the "first free-wheeling diode", and each of the FWDs 411, 413, and 415 corresponds to the "second free-wheeling diode".

The resistors Ru, Rv, and Rw detect currents flowing through the U-phase, V-phase, and W-phase switching devices, respectively. The voltages respectively generated in the resistors Ru, Rv, and Rw are referred to as a "voltage Vsu", a "voltage Vsv", and a "voltage Vsw", respectively.

The terminal P is applied with the power supply voltage Vdc, the terminals U, V, and W are provided with the three-phase motor 220 which is a load, and the terminals NU, NV, and NW are grounded.

The HVICs 301 to 303 are integrated circuits for performing switching of the upper-arm IGBTs 400, 402, and 404 using signals input from a microcomputer (not illustrated) via the terminals HU, HV, and HW, respectively.

The LVIC 304 is an integrated circuit for performing switching of the lower-arm IGBTs 401, 403, and 405 using drive signals Vdru, Vdrv, and Vdrw input from a microcomputer (not illustrated) via the terminals LU, LV, and LW.

A diagram of the internal configuration of the LVIC 304 is omitted. However, the LVIC 304 includes three circuits, which are the filter 50 of the LVIC 22 in FIG. 6, the detection circuit 51, and the drive circuit 52, for each of the three phases. Specifically, the LVIC 304 includes "the filter 50, the detection circuit 51, and the drive circuit 52" for the U-phase, "the filter 50, the detection circuit 51, and the drive circuit 52" for the V-phase, and "the filter 50, the detection circuit 51, and the drive circuit 52" for the W-phase. As a result, the LVIC 304 can reduce change in the reverse bias voltages of the upper-arm FWDs 410, 412, and 414 even when driving the three-phase motor 220. Accordingly, it is possible to reduce noise generated in the power module 210.

===Summary===

The power modules 10, 200, and 210 according to an embodiment of the present disclosure have been described above. In general, when the inductor current IL decreases, the reverse bias voltage VR of the upper-arm FWD 32 abruptly changes. However, the drive circuit 52 controls the magnitude of the current for charging the gate capacitance of the IGBT 31 according to the magnitude of the inductor current IL. Specifically, the drive circuit 52 reduces the source current Is in accordance with a decrease in the inductor current IL, and thus a time period during which the gate capacitance of the IGBT 31 is charged increases. As a result, the drive circuit 52 turns on the IGBT 31 over a time period (e.g., the time t52 to t53 in FIG. 9) that is longer than that in the case where the inductor current IL is large. Accordingly, even when the inductor current IL decreases, it is possible to prevent abrupt change in the voltage VR, thereby being able to reduce noise.

Further, such a configuration in which the IGBT 31 is turned on in a time period that increases with a decrease in the inductor current IL can use a voltage-drive type LVIC. For example, the on-resistance of the switch SW1 in the LVIC 25 is increased according to a decrease in the inductor current IL, thereby being able to obtain an effect similar to that in an embodiment of the present disclosure. However, in the case where the voltage-drive type LVIC 25 is used, inrush current may be generated when the IGBT 31 is turned on (e.g., the time t40 in FIG. 9). The LVIC 22 is a current-drive type integrated circuit, and thus generation of inrush current can be prevented when the IGBT 31 is driven, which can reduce switching noise.

Further, the drive circuit 52 uses the NMOS transistor 73 when the IGBT 31 is turned off. Accordingly, it is possible to immediately discharge the gate capacitance of the IGBT 31.

Further, the detection circuit 51 samples and holds the voltage Va at a predetermined timing at which the IGBT 31 is turned off. Since the sampling timing is predetermined as such, it is possible to generate the source current Is with high accuracy. Note that the timing at which the IGBT 31 is turned off corresponds to the timing at which the inductor current IL and the current flowing through the IGBT 31 become maximum.

Further, the source current Is may be adjusted based on whether the voltage Va has become higher than the sampled voltage Vb. Even by such a method, the LVIC 22 can reduce a change in the reverse bias voltage VR of the FWD 32.

Further, in an embodiment of the present disclosure, the filter 50 for reducing noise of the voltage Vs is provided, to detect the output of the filter 50. Accordingly, the drive circuit 52 can generate the source current Is corresponding to the inductor current IL with high accuracy.

Further, it is assumed that the switching devices included in the half-bridge circuit 20 and the bridge circuit 300 are IGBTs, for example, however, the switching devices may be MOS (metal-oxide-semiconductor) transistors, for example. In such a case, a free-wheeling diode with respect to such a switching device is realized by a body diode of a MOS transistor.

Embodiments of the present disclosure described above are simply for facilitating the understanding of the present disclosure and are not in any way to be construed as limiting the present disclosure. The present disclosure may variously be changed or altered without departing from its gist and encompass equivalents thereof.

The current generating circuit 71 according to an embodiment of the present disclosure adjusts the source current Is by switching on and off of the switches 110 to 112, however, it is not limited thereto. The current generating circuit 71 may be, for example, a voltage control current source that changes the current value of the source current Is using the voltage Vb of the detection circuit 51.

Further, a circuit for power conversion may not be the half-bridge circuit 20, but may be an H-bridge circuit or another circuit, for example. In such a case, the H-bridge circuit corresponds to the "switch circuit".

What is claimed is:
1. An integrated circuit for a switch circuit, the switch circuit including
 a first switching device on a power supply side of the switch circuit and a second switching device on a ground side of the switch circuit, the first and second switching devices being connected in series, the second switching device having a gate terminal,
 a first free-wheeling diode connected in parallel with the first switching device, and
 a second free-wheeling diode connected in parallel with the second switching device,
the integrated circuit being configured to perform switching of the second switching device, the integrated circuit comprising:
 a detection circuit that detects a load current flowing through a load of the switch circuit; and
 a drive circuit connected to the detection circuit and the gate terminal of the second switching device, the drive circuit being configured to
 receive a drive signal, control magnitude of a current flowing to the gate terminal of the second switching device, to thereby charge a gate capacitance of the second switching device according to a detection result of the detection circuit, when the drive signal is at one logic level, and turn off the second switching device when the drive signal is at another logic level, wherein the drive circuit includes a switch for applying a ground voltage to the gate terminal of the second switching device, when the drive signal is at said another logic level.

2. The integrated circuit according to claim 1, wherein the drive circuit further comprises:

a current generating circuit that generates a source current that decreases with a decrease in the load current, based on the detection result of the detection circuit; and another switch that supplies the source current to the gate terminal of the second switching device when the drive signal is at the one logic level.

3. The integrated circuit according to claim 1, wherein the detection circuit samples and holds a voltage corresponding to the load current based on a predetermined timing.

4. An integrated circuit for a switch circuit, the switch circuit including a first switching device on a power supply side of the switch circuit and a second switching device on a ground side of the switch circuit, the first and second switching devices being connected in series, the second switching device having a gate terminal, a first free-wheeling diode connected in parallel with the first switching device, and a second free-wheeling diode connected in parallel with the second switching device, the integrated circuit being configured to perform switching of the second switching device, the integrated circuit comprising:

a detection circuit that detects a load current flowing through a load of the switch circuit; and a drive circuit connected to the detection circuit and the gate terminal of the second switching device, the drive circuit being configured to receive a drive signal, control magnitude of a current flowing to the gate terminal of the second switching device, to thereby charge a gate capacitance of the second switching device according to a detection result of the detection circuit, when the drive signal is at one logic level, and turn off the second switching device when the drive signal is at another logic level, wherein the detection circuit samples and holds a voltage corresponding to the load current at a first timing, and the drive circuit comprises a comparison circuit that compares a first voltage corresponding to the load current and a second voltage held by the detection circuit, a holding circuit that holds a comparison result of the comparison circuit at a second timing, a current generating circuit that generates a source current that increases when the comparison result indicates that the first voltage is greater than the second voltage, and decreases when the comparison result indicates that the first voltage is smaller than the second voltage, and a switch that supplies the source current to the gate terminal of the second switching device when the drive signal is at the one logic level.

5. The integrated circuit according to claim 1, further comprising a filter that reduces noise of a voltage corresponding to the load current, and outputs a resultant voltage to the detection circuit.

6. The integrated circuit according to claim 1, wherein each of the first switching device and the second switching device is an Insulated Gate Bipolar Transistor.

7. The integrated circuit according to claim 1, wherein each of the first switching device and the second switching device is a metal-oxide-semiconductor (MOS) transistor, and each of the first free-wheeling diode and the second free-wheeling diode is a body diode of the MOS transistor.

8. A semiconductor device, comprising:

a switch circuit that comprises a first switching device on a power supply side of the switch circuit and a second switching device on a ground side of the switch circuit, the first and second switching devices being connected in series, the second switching device having a gate terminal, a first free-wheeling diode connected in parallel with the first switching device, and a second free-wheeling diode connected in parallel with the second switching device; and an integrated circuit that performs switching of the second switching device in the switch circuit, the integrated circuit including a detection circuit that detects a load current flowing through a load of the switch circuit; and a drive circuit connected to the detection circuit and the gate terminal of the second switching device, the drive circuit being configured to receive a drive signal, control magnitude of a current flowing to the gate terminal of the second switching device, to thereby charge a gate capacitance of the second switching device according to a detection result of the detection circuit, when the drive signal is at one logic level, and turn off the second switching device when the drive signal is at another logic level, wherein the drive circuit includes a switch for applying a ground voltage to the gate terminal of the second switching device, when the drive signal is at said another logic level.

* * * * *